United States Patent
Park et al.

(10) Patent No.: US 7,863,643 B2
(45) Date of Patent: Jan. 4, 2011

(54) MEMORY CELL DEVICE HAVING VERTICAL CHANNEL AND DOUBLE GATE STRUCTURE

(75) Inventors: Byung Gook Park, Seocho-gu (KR); Il Han Park, Gwanak-gu (KR)

(73) Assignee: Seoul National University Industry Foundation (KR)

( * ) Notice: Subject to any disclaimer, the term of this patent is extended or adjusted under 35 U.S.C. 154(b) by 109 days.

(21) Appl. No.: 12/309,959

(22) PCT Filed: Sep. 20, 2007

(86) PCT No.: PCT/KR2007/004613

§ 371 (c)(1),
(2), (4) Date: Feb. 4, 2009

(87) PCT Pub. No.: WO2008/038953

PCT Pub. Date: Apr. 3, 2008

(65) Prior Publication Data

US 2009/0242965 A1    Oct. 1, 2009

(30) Foreign Application Priority Data

Sep. 25, 2006   (KR) .................. 10-2006-0093138

(51) Int. Cl.
*H01L 29/66* (2006.01)
(52) U.S. Cl. .................. 257/135; 257/250; 257/302
(58) Field of Classification Search ............... 257/135, 257/250, 278, 302
See application file for complete search history.

(56) References Cited

U.S. PATENT DOCUMENTS

| 5,483,094 | A | * | 1/1996 | Sharma et al. | ............. 257/316 |
| 5,627,390 | A | * | 5/1997 | Maeda et al. | ............. 257/302 |
| 6,670,642 | B2 | | 12/2003 | Takaura et al. | |
| 6,853,023 | B2 | * | 2/2005 | Goebel et al. | ............. 257/301 |
| 6,939,763 | B2 | | 9/2005 | Schlosser et al. | |
| 6,943,373 | B2 | | 9/2005 | Takaura et al. | |
| 7,098,478 | B2 | | 8/2006 | Takaura et al. | |
| 2005/0253180 | A1 | | 11/2005 | Schlosser et al. | |
| 2006/0171209 | A1 | | 8/2006 | Sim et al. | |

FOREIGN PATENT DOCUMENTS

| KR | 10-0431489 | 9/2001 |
| KR | 10-2003-0032239 | 4/2003 |
| KR | 10-2005-0094200 | 9/2005 |

* cited by examiner

*Primary Examiner*—Phat X Cao
(74) *Attorney, Agent, or Firm*—Gerald E. Hespos; Michael J. Porco

(57) ABSTRACT

A memory cell device having a vertical channel and a double gate structure is provided. More specifically, a memory cell device having a vertical channel and a double gate structure is characterized by having a pillar active region with a predetermined height, which is including a first semiconductor layer forming a first source/drain region, a second semiconductor layer being placed under the first semiconductor layer with a predetermined distance and forming a second source/drain region, and a third semiconductor layer forming a body region and a channel region between the first semiconductor layer and the second semiconductor layer, and therefore, there is no need for unnecessary contacts when it is used as a unit cell for any type of memory array, not to speak of NOR type flash memory array. And the present invention makes to program/erase more effectively and increase the read speed and the amount of sensing current.

15 Claims, 7 Drawing Sheets

【Figure 1】
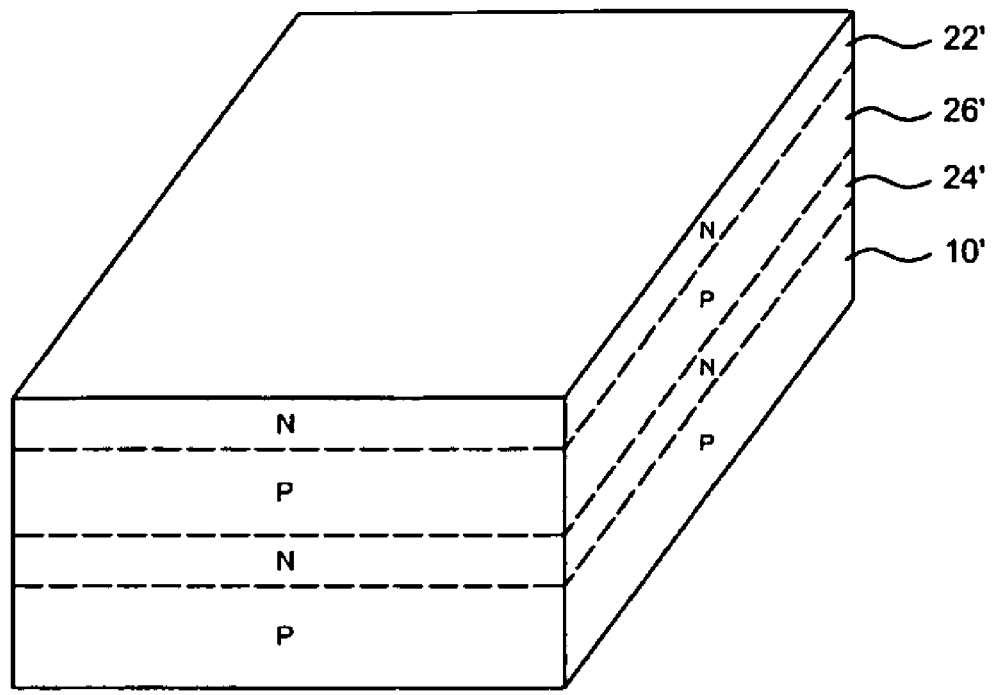
【Figure 2】
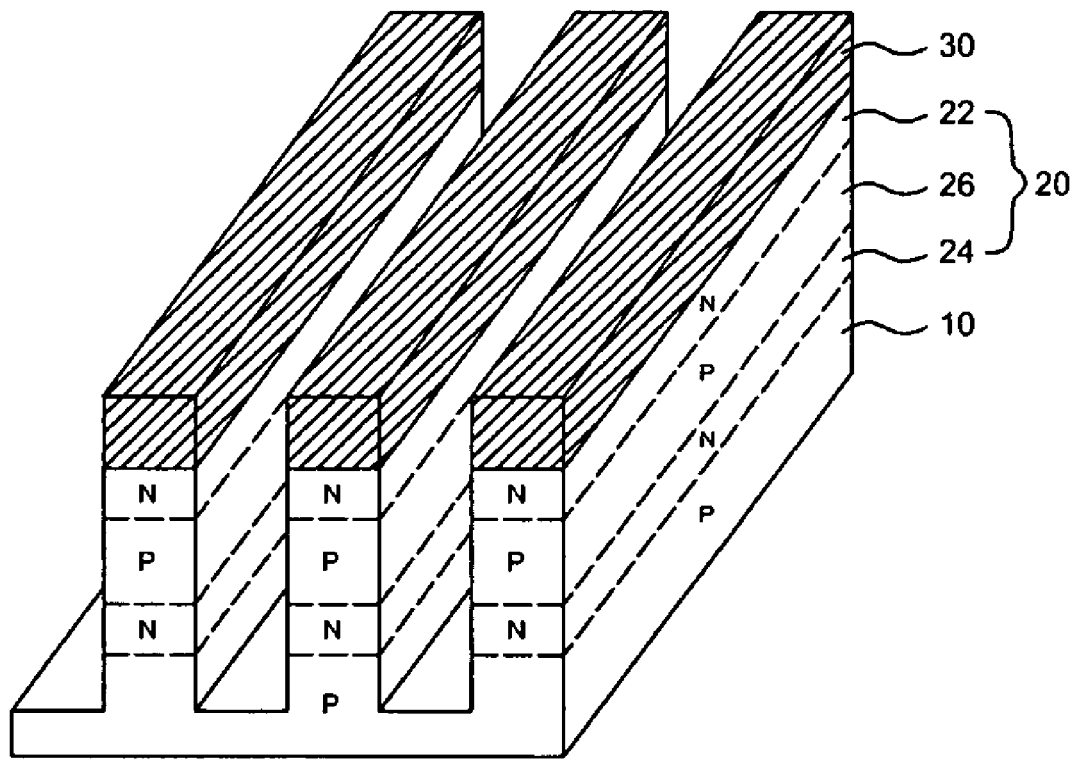

[Figure 3]
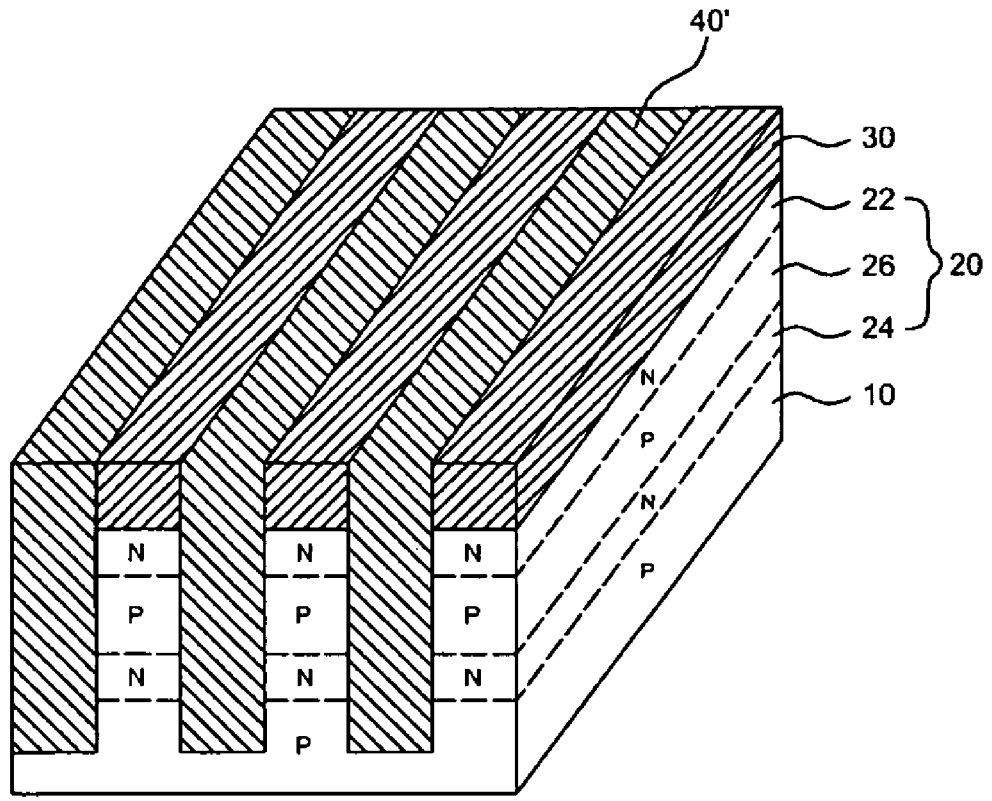
[Figure 4]
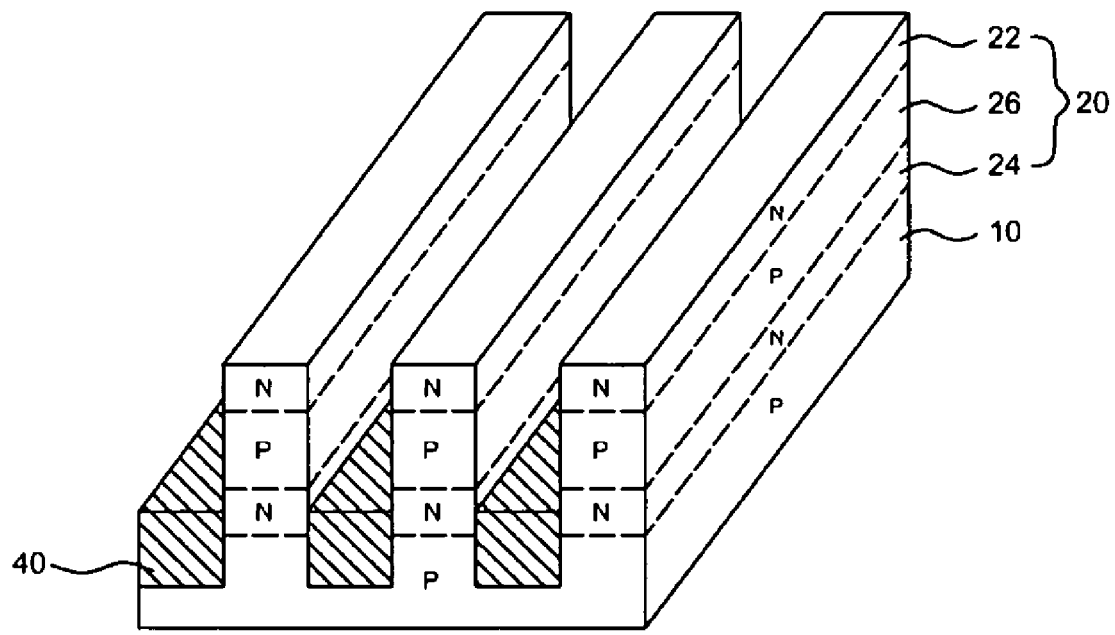

[Figure 5]
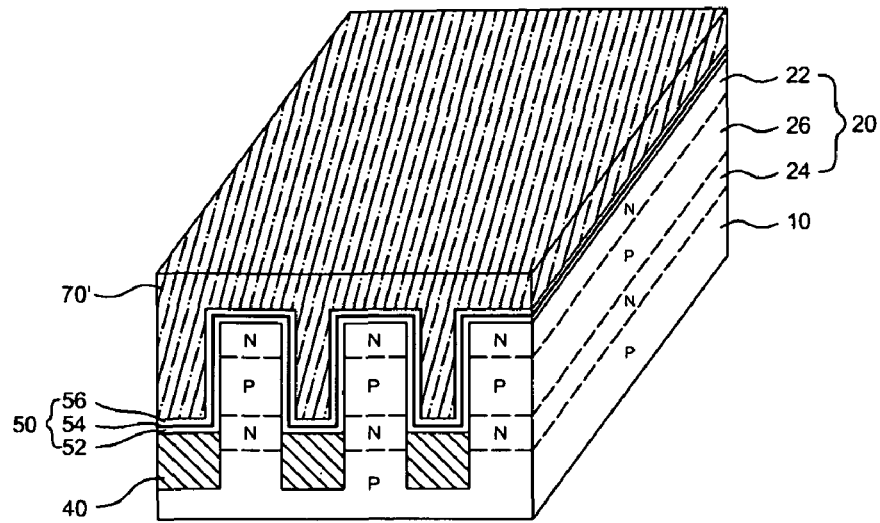
[Figure 6]
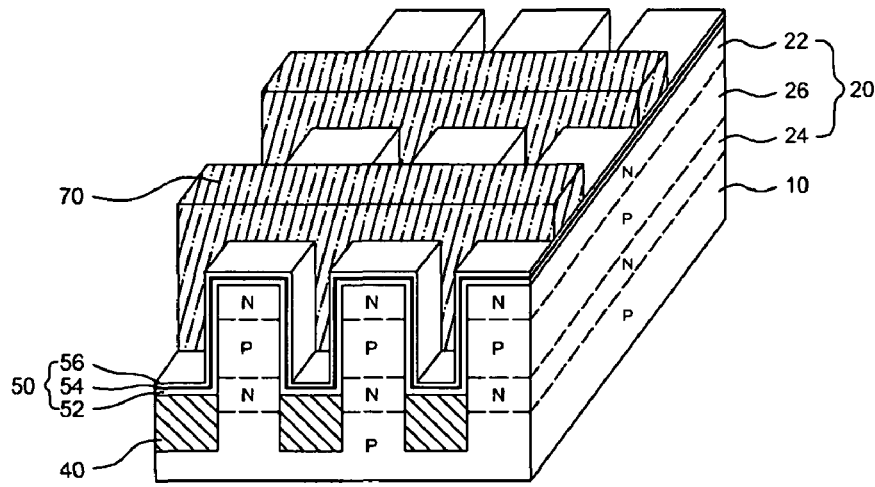
[Figure 7]
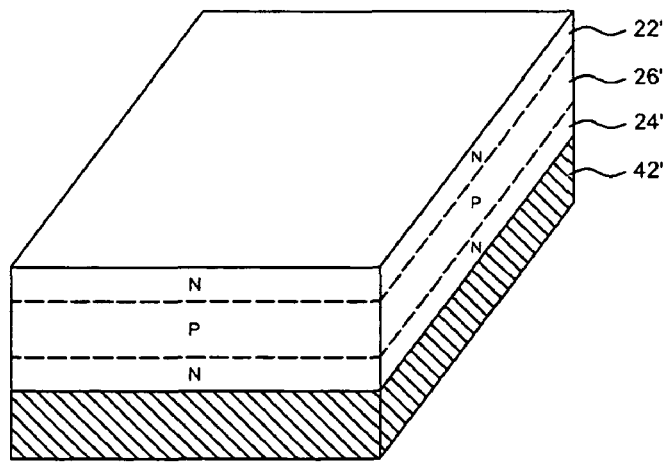

[Figure 8]
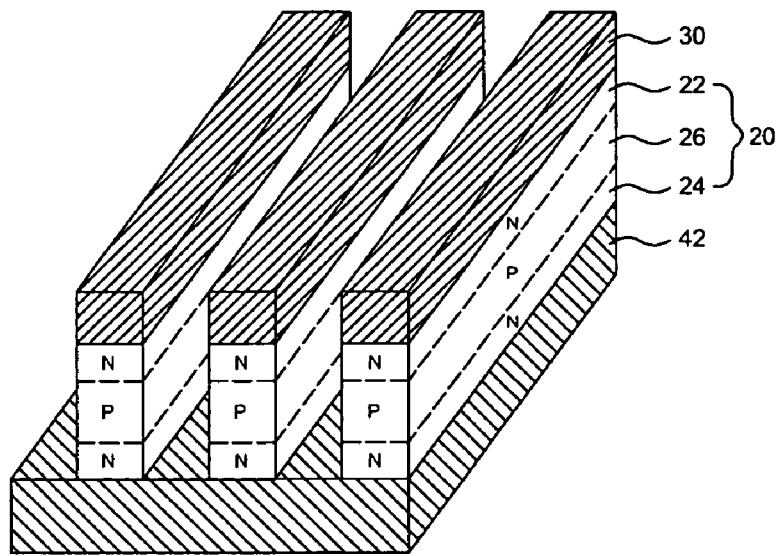
[Figure 9]
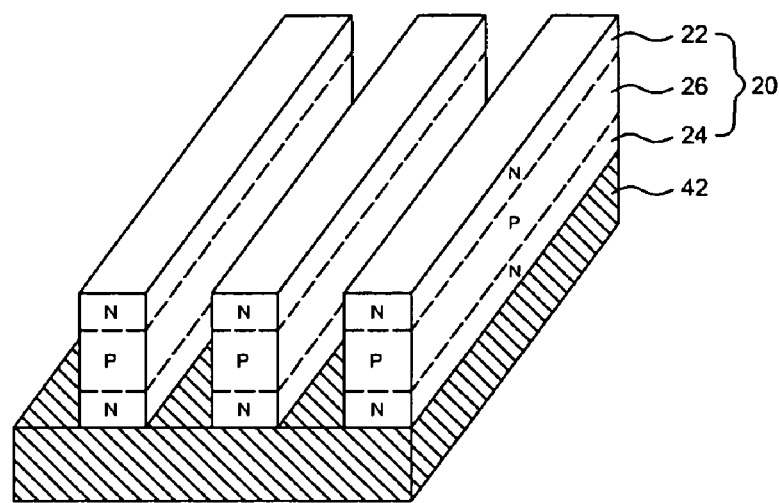
[Figure 10]
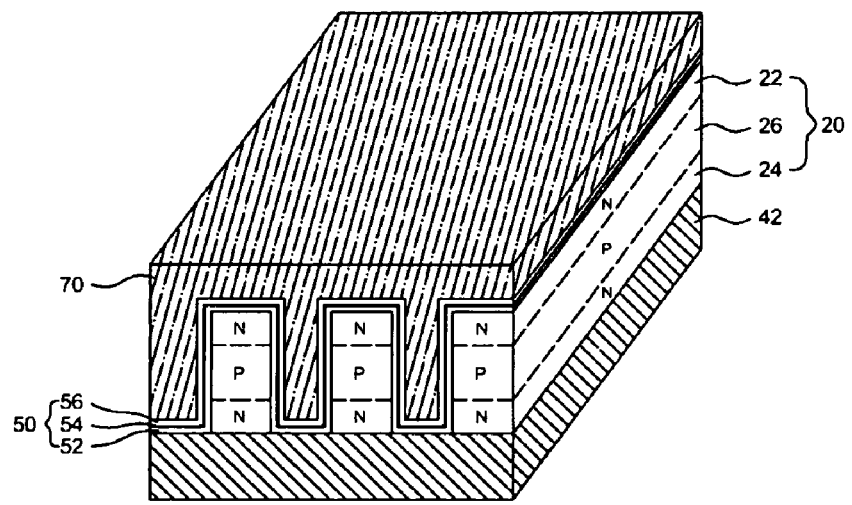

[Figure 11]
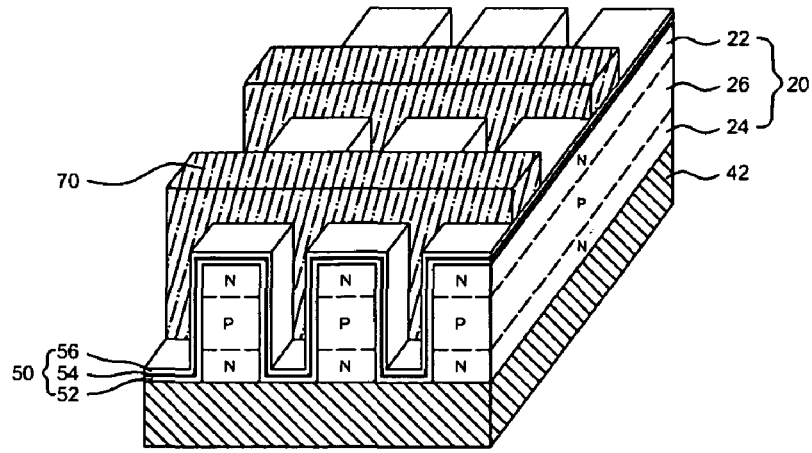
[Figure 12]
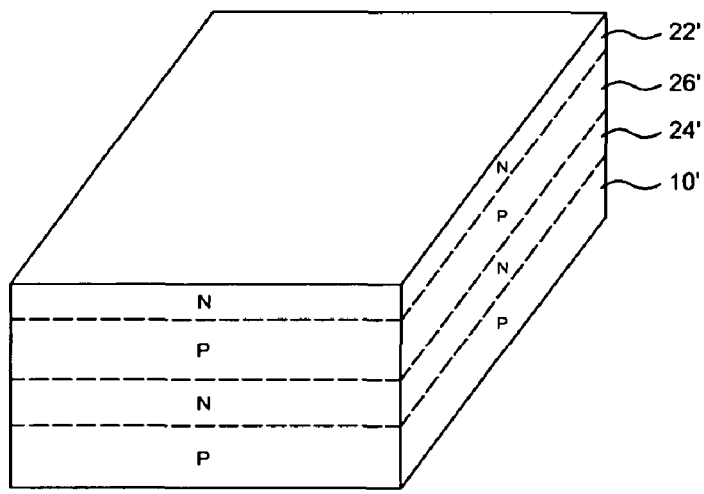
[Figure 13]
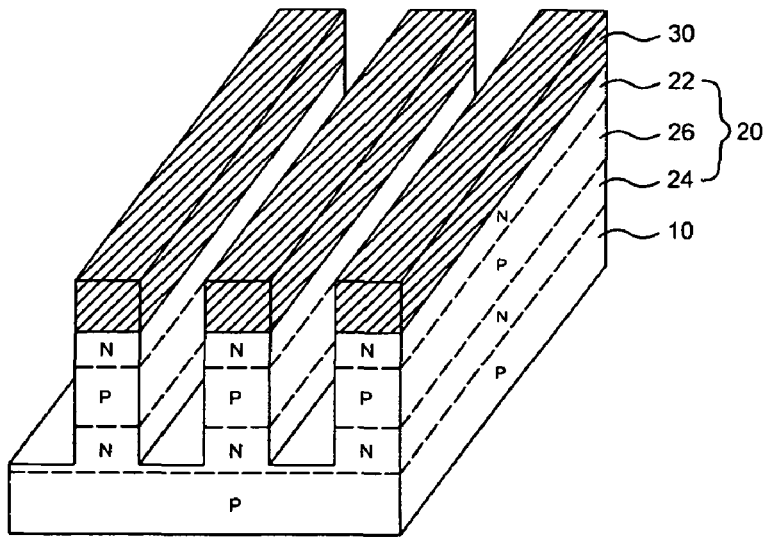

[Figure 14]
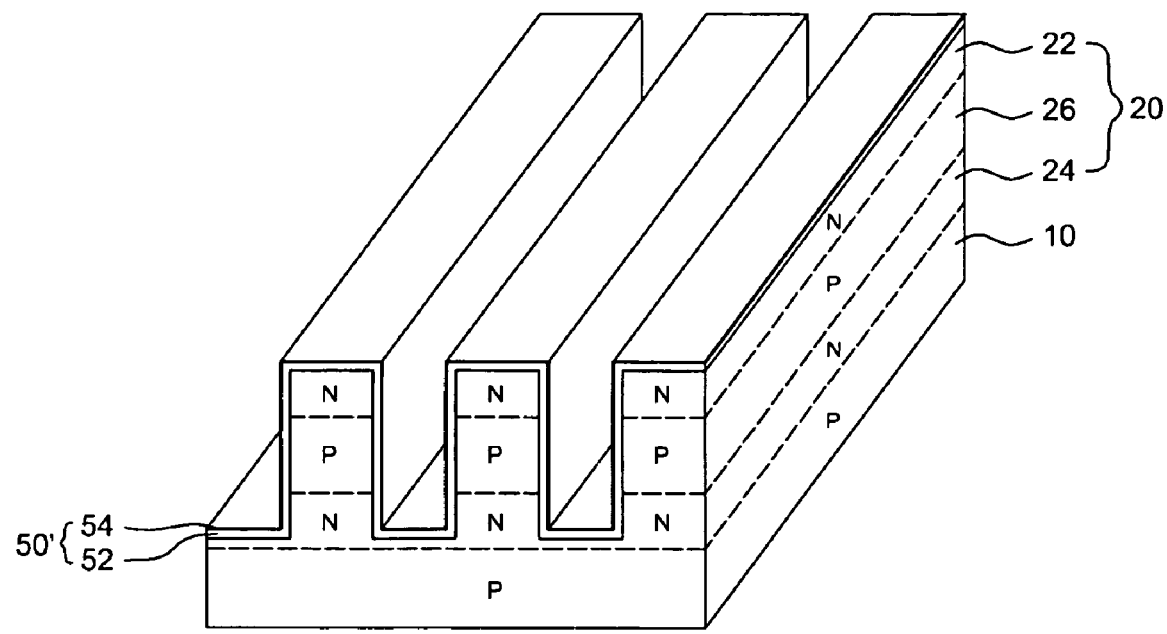
[Figure 15]
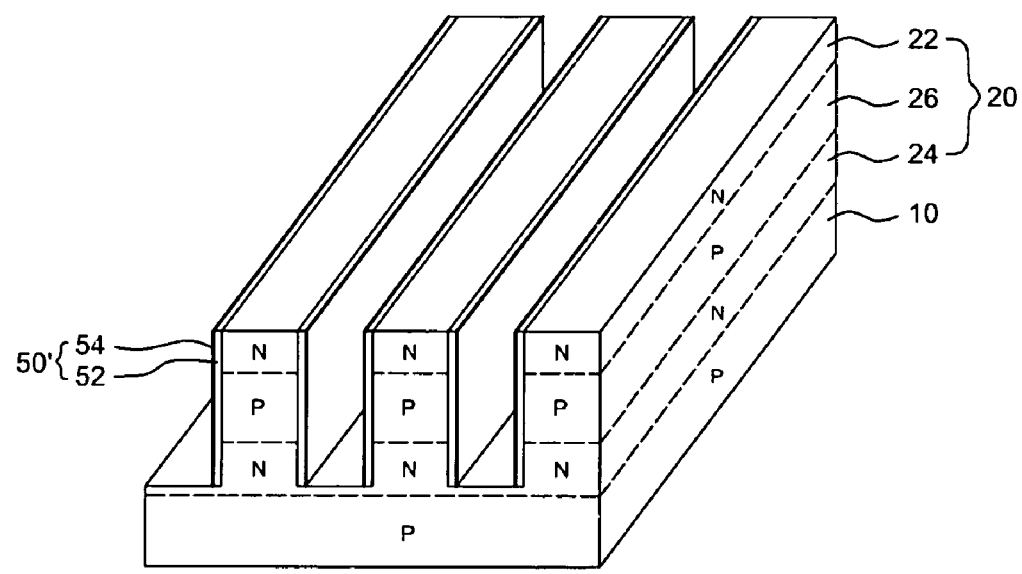

[Figure 16]
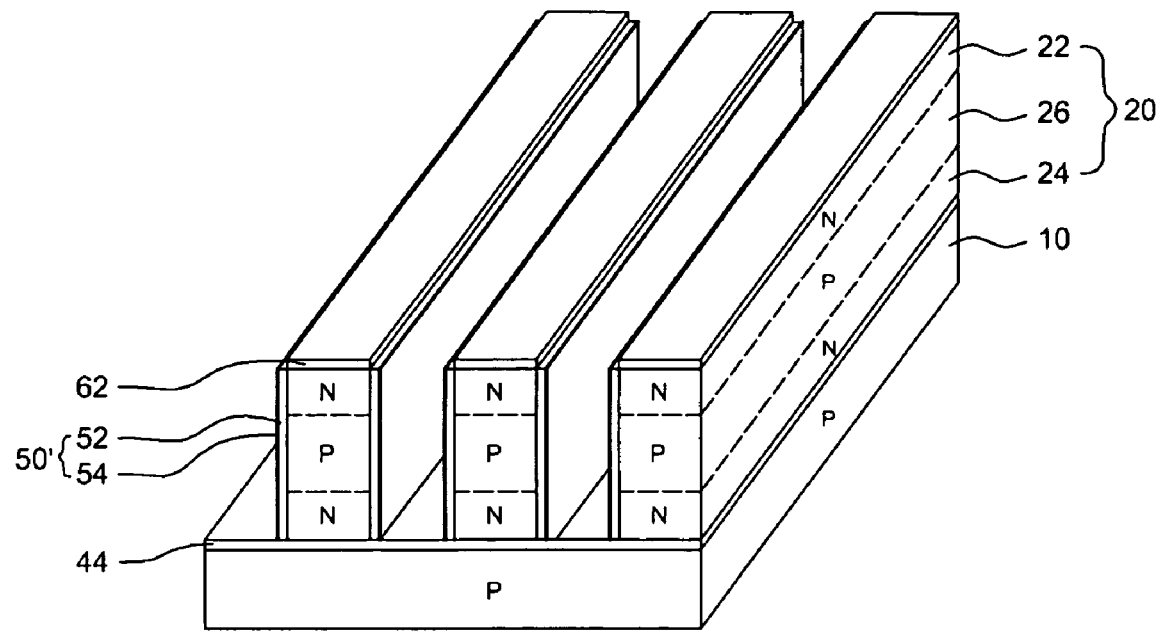
[Figure 17]
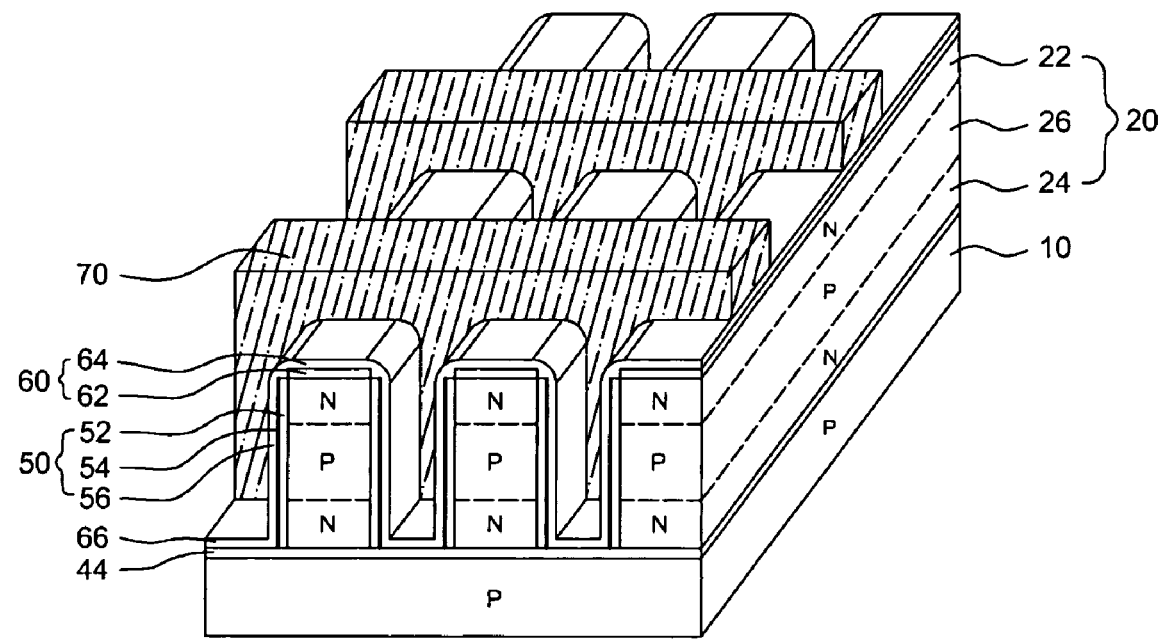

MEMORY CELL DEVICE HAVING VERTICAL CHANNEL AND DOUBLE GATE STRUCTURE

BACKGROUND OF THE INVENTION

1. Field of the Invention

The present invention relates to a nonvolatile memory device, and more specifically to a nonvolatile memory cell structure having a vertical channel and a double gate structure.

2. Description of the Related Art

Currently, a nonvolatile memory device has characteristics to remove and store data electrically, and store data even if electric power supply is unavailable, and therefore, it has been used widely for electronic equipment such as memory cards for music or image data and mobile phones for which constant electric power supply is impossible or electric power supply is stopped intermittently.

While a flash memory device selects one cell structure for one transistor to overcome the integrity limit of EEPROM (Electrically Erasable Programmable Read Only Memory), it makes to input or output data electrically and freely, and the demand for the flash memory device has increased rapidly along with the development of mobile and multimedia industry.

A flash memory is classified as NOR and NAND type, according to its array organization of unit cells. In a NOR type flash memory, two or more cell transistors are connected to one bit line in parallel, and in a NAND type, two or more cell transistors are connected to one bit line in series.

In a NOR type flash memory, one memory cell transistor is connected between a drain connected to a bit line and a source connected to a common source line, and therefore, a NOR type flash memory has advantages of increasing electric current of a memory cell and operating at high speed. However, unlike a NAND type flash memory, it has a difficulty in high-integration due to the increasing area of a bit line contact and a source line.

To overcome this disadvantage of a NOR type flash memory, memory size reduction has been tried.

However, the way to improve the memory integration by reducing the channel width in the planar type device structure has retained some limitations related with the semiconductor process technology and the device operation.

To overcome the said problems, especially in a SONOS memory device, attempts to make a SONOS (Silicon-Oxide-Nitride-Oxide-Silicon) memory device structure as a double gate structure were made (Korean Patent No. 431489). However, such attempts have the limitation on high integration due to the area of a bit line contact and source line.

SUMMARY OF THE INVENTION

To solve the problems, the present invention is directed to a nonvolatile memory cell having a vertical channel and a double gate structure by forming a pillar active region having a vertical channel by accumulating a plurality of semiconductor layers. So, there is no need for unnecessary contacts when a nonvolatile memory cell in the present invention is used as a unit cell for any other types of memory array, not to speak of NOR type flash memory array, and it makes it possible to overcome the high integration limitation in the conventional memory devices.

In addition, another aspect of the present invention is to provide a nonvolatile memory cell having a vertical channel and a double gate structure, which has an insulating layer comprised of two or more dielectric layers on the both sides of a pillar active region. So, the present invention can make to program/erase more effectively and increase the read speed and the amount of sensing current, and it can solve the uniformity problem of a tunnel oxide layer in the conventional planar type memory cell thoroughly.

To accomplish objectives of the present invention, a memory cell according to embodiments of the present invention can be characterized by a memory cell device having a vertical channel and a double gate structure, which comprises a pillar active region with a predetermined height, which is including a first semiconductor layer forming a first source/drain region, a second semiconductor layer being placed under the first semiconductor layer with a predetermined distance and forming a second source/drain region, and a third semiconductor layer forming a body region and a channel region between the first semiconductor layer and the second semiconductor layer; a field region separating the pillar active region; a first insulating layer comprising two or more dielectric layers including a charge trap layer on the both sides of the pillar active region; a second insulating layer comprising one or more dielectric layers on the first semiconductor layer and the field region; and a control gate formed on the first insulating layer and the second insulating layer.

The field region can be formed with an oxide layer filling a space with a predetermined thickness between neighboring pillar active regions under one side of the second semiconductor layer, or it can be formed with a buried oxide layer of a SOI substrate (when the active region is formed with a silicon layer of a SOI substrate). Or the field region can be formed with a oxide layer formed by an oxidative encroachment on a bulk silicon substrate under the second semiconductor layer.

It is preferable that the charge trap layer is a nitride layer.

It is another characteristic that the first semiconductor layer and the second semiconductor layer are N-type, and the third semiconductor layer is P-type, so the active region of the present invention is a NPN doping structure with a predetermined height.

The second insulating layer can be the same as the first insulating layer and it can make a fabricating process simpler.

According to the present invention, even if a memory cell of the present invention can be used as a unit cell for not only NOR type flash memory array but also any other types of memory array, different electrical signal lines are connected respectively to a first semiconductor layer and a second semiconductor layer which are formed in a pillar active region with a predetermined height, and high integration for any type of memory is possible because there is no need for unnecessary contacts.

By forming a first insulating layer comprising two or more dielectric layers including charge trap layers on both sides of a pillar active region, program/erase can be done effectively, and the read speed and the amount of sensing current can be increased.

In addition, by controlling the height of a third semiconductor layer as a body region and a channel region, a charge trap layer can be extended and the uniformity problem of a tunnel oxide layer in the conventional planar type memory cell can be overcome thoroughly.

BRIEF DESCRIPTION OF THE DRAWINGS

FIGS. 1 to 6 show the fabricating process according to the first embodiment of the present invention.

FIGS. 7 to 11 show the fabricating process according to the second embodiment of the present invention.

FIGS. 12 to 17 show the fabricating process according to the third embodiment of the present invention.

Reference number 10 indicates a semiconductor substrate, 20 means a pillar active region, 30 means a mask, 40 means a field region, 50 means a first insulating layer, 60 means a second insulating layer and 70 means a control gate.

DETAILED DESCRIPTION OF THE PREFERRED EMBODIMENTS

Detailed descriptions of preferred embodiments of the present invention are provided with respect to the accompanying drawings. It must be comprehended that the following preferred embodiments are exemplary only to help understand the present invention and not to limit its interpretation.

First of all, as shown in one of FIGS. 6, 11 and 17, a basic memory cell structure of the present invention can comprise: a pillar active region 20 with a predetermined height, which is including a first semiconductor layer 22 forming a first source/drain region, a second semiconductor layer 24 being placed under the first semiconductor layer with a predetermined distance and forming a second source/drain region, and a third semiconductor layer 26 forming a body region and a channel region between the first semiconductor layer and the second semiconductor layer; a field region 40, 42 and 44 separating the pillar active region; a first insulating layer 50 comprising two or more dielectric layers including a charge trap layer 54 on the both sides of the pillar active region; a second insulating layer 60 and 66 comprising one or more dielectric layers on the first semiconductor layer and the field region; and a control gate 70 formed on the first insulating layer and the second insulating layer.

When a memory cell of the present invention is used as a unit cell of a NOR flash memory array, the first semiconductor 22 is connected to a bit line, the second semiconductor layer 24 is connected to a common source line, and the third semiconductor layer 26 is connected to a body biasing terminal electrically. Therefore, it is unnecessary for each cell to have special areas for a bit line contact and a source line, and high integration is possible for a NOR type flash memory like a NAND type flash memory.

In addition, even if a memory cell of the present invention is used as a unit cell of any other types of memory array, different electrical signal lines are connected respectively to a first semiconductor layer 22 and a second semiconductor layer 24 which are formed in the pillar active region 20. And so high integration is possible for any other types of memory by the present invention.

Moreover, because a first insulating layer 50 comprising two or more dielectric layers including a charge trap layer 54 is formed on the both sides of the pillar active region 20, program/erase is done effectively by permitting electrons to come from a third semiconductor layer 26 and go to the both charge trap layers 54 by the cell operation, wherein program can be accomplished by not only CHEI (Channel Hot Electron Injection) but also FN (Fowler Nordheim). Because read can be accomplished by a first semiconductor 22 and a second semiconductor layer 24, which are adjoining each other, and two vertical channels, the read speed and the amount of sensing current can be increased.

In addition, the charge trap layer 54 can be extended by controlling the height of the third semiconductor layer 26. The uniformity problem of a tunnel oxide layer in the conventional planar type memory cell having an O/N/O (Oxide/Nitride/Oxide) layer can be also overcome thoroughly, and so cell degradation can be prevented, by controlling the height of the third semiconductor layer 26.

First Embodiment

In the basic structure, a field region 40 is formed with an oxide layer filling a space with a predetermined thickness between neighboring pillar active regions under one side of the second semiconductor layer 24, as shown in FIG. 6.

FIGS. 1 to 6 show the fabricating process according to the first embodiment of the present invention.

First of all, as shown in FIG. 1, an N-type doping layer 24' is formed uniformly in the deep site by injecting N-type impurities with proper dose and energy to a P-type semiconductor substrate 10' to form a second semiconductor layer 24. Then, the same N-type doping layer 22' is formed uniformly in the shallow site by injecting the same N-type impurities with the same dose but smaller energy to a P-type semiconductor substrate 10' to form a first semiconductor layer 22. It is more preferable to form a P-type doping layer 26' for forming a third semiconductor layer 26 by injecting P-type impurities with proper dose and energy into between a N-type doping layer 22' for the first semiconductor layer and a N-type doping layer 24' for the second semiconductor layer, after forming a second semiconductor layer 24, but before forming a first semiconductor layer 22.

Then, as shown in FIG. 2, a pillar active region 20 with a predetermined height is formed by depositing a nitride layer on the N-type doping layer 22' for the first semiconductor layer, making a mask by a photolithography process, and then etching silicon with a predetermined depth by using the nitride layer mask 30. The etching silicon should be done to etch a substrate under the N-type doping layer 24' for the second semiconductor layer 24 with a predetermined depth.

Then, a planarization process is done by filling an insulating material like an oxide layer onto the whole side of the substrate and CMP (Chemical Mechanical Polishing) process, as shown in FIG. 3. The nitride layer mask 30 functions as an etch stopper.

Then, as shown in FIG. 4, the nitride layer mask 30 and the oxide layer 40' is removed by etching. It is preferable to etch for the oxide layer to contact with the second semiconductor layer 24.

Then, as shown in FIG. 5, a first insulating layer and a second insulating layer are formed simultaneously by depositing an O/N/O layer 50 on the whole side of the substrate. After that, a gate material 70' is deposited onto the first and the second insulating layers.

Then, as shown in FIG. 6, a masking material (such as a photoresist) is deposited on the gate material 70', a mask is made by a photolithography process, the gate material 70' is etched by using the mask for a control gate 70, and then a memory cell of the present invention is embodied.

Second Embodiment

A memory cell of the present invention can be embodied by using a SOI substrate, as shown in FIG. 11. In the basic structure, the pillar active region 20 is formed with a silicon layer of a SOI substrate and the field region is a buried oxide layer 42 of a SOI substrate.

FIGS. 7 to 11 show the fabricating process according to the second embodiment of the present invention.

The fabricating process for the second embodiment is almost the same as the fabricating process for the first embodiment. Differences between the two fabricating processes are following:

First, as shown in FIG. 7, NPN doping layers 22', 24' and 26' are formed orderly in the silicon layer of a SOI substrate.

Then, as shown in FIG. 8, a pillar active region 20 with a predetermined height is formed by using a nitride layer or other material mask 30 and etching silicon. The etching silicon should be done to reveal the buried oxide layer 42. Unlike the first embodiment, there is no need to proceed the depositing an oxide layer and the planarization process, and the fabricating process is easy and economical.

Then, as shown in FIG. 9, the mask is removed by etching. As shown in FIG. 10, a first insulating layer and a second insulating layer are formed simultaneously by depositing an O/N/O layer 50 on the whole side of the substrate. After that, a gate material 70' is deposited onto the first and the second insulating layers.

Then, as shown in FIG. 11, a masking material (such as a photoresist) is deposited on the gate material 70', a mask is made by a photolithography process, the gate material 70' is etched by using the mask for a control gate 70, and then a memory cell of the present invention is embodied.

Third Embodiment

A memory cell of the present invention, as shown in FIG. 17, in the basic structure, a field region is formed with a oxide layer 44 formed by an oxidative encroachment on a bulk silicon substrate 10 under the second semiconductor layer 24.

FIGS. 12 to 17 show the fabricating process according to the third embodiment of the present invention.

The fabricating process for the third embodiment is almost the same as the fabricating process for the first embodiment. Differences between the two fabricating processes are following:

First, as shown in FIG. 12, NPN doping layers 22', 24' and 26' are formed orderly onto a P-type bulk substrate. It is preferable for the N-type doping layer 24' for the second semiconductor layer 24 to be formed slightly thicker than the N-type doping layer 24' in the first embodiment.

Then, as shown in FIG. 13, a pillar active region 20 with a predetermined height is formed by forming a nitride layer mask 30 and etching silicon. Unlike the first embodiment, the etching silicon should be done to etch only up to the lower part of the N-type doping layer 24' for the second semiconductor layer 24. Like the second embodiment, there is no need to proceed the depositing an oxide layer and the planarization process, and the fabricating process is economical.

Then, as shown in FIG. 14, the mask 30 is removed and an O/N (Oxide/Nitride) layer 50' is deposited orderly onto the whole side of the substrate.

Then, as shown in FIG. 15, the O/N layer 50' only on the surface of a N-type doping layer 24' for the second semiconductor 24 between the pillars is etched selectively by an anisotropic etching.

Then, as shown in FIG. 16, an oxide layer 44 is formed by an oxidative encroachment from the N-type doping layer 24' for the second semiconductor layer 24 revealed between two pillars to the N-type doping layer 24' under the pillar. Naturally, an oxidative layer 62 is formed on the N-type doping layer 22' for the first semiconductor layer 22 revealed on the pillar. However, oxidation cannot occur on the side wall of the pillar with a nitride layer.

Because the oxide layer 44 under the pillar is formed by a reduced bird's beak field oxidation process, time for the oxidation process should be long enough to form the oxide layer 44 under the pillar according to the thickness of the pillar.

Then, as shown in FIG. 11, a first insulating layer is formed by depositing an oxide layer 56, 64 and 66 onto the whole side of the substrate uniformly, and a second insulating layer 60 is formed by an oxide layer 62, 64; 44, 66 on the upper end of the pillar and the bottom between the pillars. However, the depositing an oxide layer onto the whole side of the substrate can be omitted, and a first insulating layer can be formed with only an O/N layer 50' on the both sides of a pillar.

Then, as shown in FIG. 17, the gate material 70' is deposited on the substrate, a mask is formed, the gate material 70' is etched by using the mask for a control gate 70, and then a memory cell of the present invention is embodied.

From the first embodiment to the second embodiment, the charge trap layer 54 can be a nitride layer. However, the charge trap layer cannot be defined only by the nitride layer, and any charge trap material such as nano-crystal, high k-dielectrics with a plurality of traps and so on, can be used for the charge trap layer.

The present invention doesn't use conventional floating gates but uses charge trap layers 54 for the charge storage, and deep level traps which are much in the charge trap layers can be used for the charge storage.

Due to the isolated characteristic of the charge trap layer, electrons which were injected on program don't move horizontally within the charge trap layers, and electrons maintain their position located mainly at the region where they were injected originally. Therefore, electrical isolation between neighboring cells can be done automatically.

Therefore, a first insulating layer of the present invention can be used as an O/T/O layer 50 comprising a control oxide 56, a charge trap layer 54 and a tunneling oxide layer (grown-up $SiO_2$ layer) 52, or a T/O layer comprising a charge trap layer and a tunneling layer (grown-up $SiO_2$ layer) 52. When a nitride layer is used for the charge trap layer, the former makes a SONOS (Silicon-Oxide-Nitride-Oxide-Silicon) or MONOS (Metal-Oxide-Nitride-Oxide-Silicon) structure, and the latter makes a MNOS (Metal-Nitride-Oxide-Silicon) structure. The control oxide layer can be usually a CVD (Chemical Vapor Deposition) $SiO_2$, and other high k-dielectric material such as $Al_2O_3$ an be used.

So far, the preferable embodiments of the present invention have been described herein, however, it will be evident that the present invention cannot be defined only by the described embodiments herein and it will be understood that the invention herein described are generally applicable, and executed as various modified embodiments by those skilled in the art.

According to the present invention, even if a memory cell of the present invention can be used as a unit cell for not only NOR type flash memory array but also any other types of memory array, different electrical signal lines are connected respectively to a first semiconductor layer and a second semiconductor layer, and high integration for any type of memory is possible because there is no need for unnecessary contacts.

The invention claimed is:

1. A memory cell device having a vertical channel and a double gate structure comprising:
   a pillar active region with a predetermined height, which is including a first semiconductor layer forming a first source/drain region, a second semiconductor layer being placed under the first semiconductor layer with a predetermined distance and forming a second source/drain region, and a third semiconductor layer forming a body region and a channel region between the first semiconductor layer and the second semiconductor layer,
   a field region separating the pillar active region,
   a first insulating layer comprising two or more dielectric layers including a charge trap layer on the both sides of the pillar active region,
   a second insulating layer comprising one or more dielectric layers on the first semiconductor layer and the field region, and a control gate formed on the first insulating layer and the second insulating layer.

2. The memory cell device of claim 1,
wherein the field region is formed with an oxide layer filling a space with a predetermined thickness between neighboring pillar active regions under one side of the second semiconductor layer.

3. The memory cell device of claim 1,
wherein the pillar active region is formed with a silicon layer of a SOI substrate and the field region is a buried oxide layer of the SOI substrate.

4. The memory cell device of claim 1,
wherein the field region is formed with a oxide layer formed by an oxidative encroachment on a bulk silicon substrate under the second semiconductor layer.

5. The memory cell device of claim 1,
wherein the charge trap layer is a nitride layer.

6. The memory cell device of claim 5,
wherein the first semiconductor layer and the second semiconductor layer are N-type, and the third semiconductor layer is P-type.

7. The memory cell device of claim 1,
wherein the second insulating layer is the same as the first insulating layer.

8. The memory cell device of claim 2,
wherein the charge trap layer is a nitride layer.

9. The memory cell device of claim 3,
wherein the charge trap layer is a nitride layer.

10. The memory cell device of claim 4,
wherein the charge trap layer is a nitride layer.

11. The memory cell device of claim 8,
wherein the first semiconductor layer and the second semiconductor layer are N-type, and the third semiconductor layer is P-type.

12. The memory cell device of claim 9,
wherein the first semiconductor layer and the second semiconductor layer are N-type, and the third semiconductor layer is P-type.

13. The memory cell device of claim 10,
wherein the first semiconductor layer and the second semiconductor layer are N-type, and the third semiconductor layer is P-type.

14. The memory cell device of claim 2,
wherein the second insulating layer is the same as the first insulating layer.

15. The memory cell device of claim 3,
wherein the second insulating layer is the same as the first insulating layer.

* * * * *